(12) United States Patent
Nakahara et al.

(10) Patent No.: US 8,482,689 B2
(45) Date of Patent: Jul. 9, 2013

(54) LIQUID CRYSTAL DISPLAY DEVICE

(75) Inventors: Hijiri Nakahara, Osaka (JP); Junichi Morinaga, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 257 days.

(21) Appl. No.: 13/127,718

(22) PCT Filed: Jul. 14, 2009

(86) PCT No.: PCT/JP2009/062714
§ 371 (c)(1),
(2), (4) Date: May 5, 2011

(87) PCT Pub. No.: WO2010/058621
PCT Pub. Date: May 27, 2010

(65) Prior Publication Data
US 2011/0205478 A1      Aug. 25, 2011

(30) Foreign Application Priority Data

Nov. 21, 2008   (JP) ................................. 2008-297926

(51) Int. Cl.
*G02F 1/1343* (2006.01)
(52) U.S. Cl.
USPC .......................................................... 349/39
(58) Field of Classification Search
USPC .......................................................... 349/39
See application file for complete search history.

(56) References Cited

U.S. PATENT DOCUMENTS 6,399,962 B1 * 6/2002 Kim ................................. 257/72
6,894,734 B1    5/2005 Ihara 2001/0030717 A1  10/2001 Kaneko et al.
2005/0030463 A1   2/2005 Kaneko et al.
2005/0206825 A1   9/2005 Kaneko et al.
(Continued)

FOREIGN PATENT DOCUMENTS

| JP | 04-326329 A    | 11/1992 |
| JP | 2000-056337 A  | 2/2000  |
| JP | 2000-227611 A  | 8/2000  |
| JP | 2001-194676 A  | 7/2001  |

OTHER PUBLICATIONS

English translation of Official Communication issued in corresponding International Application PCT/JP2009/062714, mailed on Jun. 30, 2011.
Official Communication issued in International Patent Application No. PCT/JP2009/062714, mailed on Sep. 29, 2009.

*Primary Examiner* — Timothy L Rude
(74) *Attorney, Agent, or Firm* — Keating & Bennett, LLP (57) ABSTRACT

The present invention provides a liquid crystal display device with a high aperture ratio in a pixel region while securing a required storage capacitance. A liquid crystal display device comprises in this order: a thin film transistor array substrate; a liquid crystal layer; and a counter substrate, the thin film transistor array substrate comprising: source lines and gate lines that are disposed in a lattice form; a storage capacitor wiring; a transparent pixel electrode disposed in a pixel region; a thin film transistor comprising a gate electrode, a source electrode, and a drain electrode; a gate insulating film between the gate electrode and the source and drain electrodes in layer sequence; and an interlayer insulating film between the source and drain electrodes and the transparent pixel electrode in layer sequence, wherein a first transparent electrode in a lower layer of the drain electrode and a second transparent electrode connected to the storage capacitor wiring are disposed on the gate insulating film, and the second transparent electrode faces the transparent pixel electrode with the interlayer insulating film therebetween.

2 Claims, 6 Drawing Sheets

U.S. PATENT DOCUMENTS

| | | | |
|---|---|---|---|
| 2006/0050191 A1* | 3/2006 | Park et al. | 349/42 |
| 2007/0002252 A1 | 1/2007 | Kaneko et al. | |
| 2007/0058097 A1* | 3/2007 | Kato et al. | 349/38 |
| 2007/0182905 A1 | 8/2007 | Kaneko et al. | |

* cited by examiner

LIQUID CRYSTAL DISPLAY DEVICE

TECHNICAL FIELD

The present invention relates to a liquid crystal display device. More specifically, it relates to an active matrix liquid crystal display device having a thin film transistor for driving a liquid crystal layer in each pixel.

BACKGROUND ART

Liquid crystal display devices are now being widely used in electronic apparatuses such as a monitor, a projector, a mobile phone, and a PDA (personal digital assistant), because of its characteristics such as slim profile, light weight, and low power consumption. In particular, an active matrix liquid crystal display device is being widely used because good image display without any cross talk between adjacent pixels can be achieved.

The active matrix liquid crystal display device is typically provided with a liquid crystal display panel in which a liquid crystal layer is held via an alignment film between a thin film transistor array substrate (hereinafter, also referred to as a "TFT (Thin Film Transistor) array substrate" and a counter substrate which are disposed at a predetermined interval. The electric field intensity, which is applied between a transparent pixel electrode of each pixel region formed on the TFT array substrate side and a common electrode formed on the counter substrate side, is controlled, and the alignment of the liquid crystal in each pixel region is changed. Thereby, the light transmittance is changed, and the image is displayed.

The counter substrate is typically a color filter substrate (hereinafter, also referred to as a "CF substrate") provided with a color filter layer of any one of three colors, R (red), G (green), and B (blue), in each pixel region. In the CF substrate, each pixel region is separated by a light-shielding film (hereinafter, also referred to as a "black matrix"). Regarding the light source of the liquid crystal display device, the transmissive liquid crystal display device provides image display by guiding light from the back side, such as light from a backlight that is arranged on the back side of a liquid crystal display panel, into the inside of the panel, and externally outputting the light.

The TFT array substrate comprises source lines and gate lines that are disposed on a main surface of a transparent substrate in a lattice form. A transparent pixel electrode is disposed in a pixel region defined by the source lines and the gate lines. A thin film transistor (hereinafter, also referred to as a "TFT") is disposed in the vicinity of an intersection between the source lines and the gate lines. The TFT comprises a gate electrode connected to the gate lines, a source electrode connected to the source lines, and a drain electrode connected to the transparent pixel electrode, and further comprises a semiconductor layer made of an amorphous silicone (a-Si). The gate electrode is covered with the gate insulating film (not illustrated). The TFT controls the transparent pixel electrode individually and selectively.

A storage capacitor wiring (hereinafter, also referred to as a "Cs wiring") is disposed between the gate lines so as to cross the source lines. Multiple Cs wirings are formed in parallel with each other on the TFT array substrate, and the identical Cs wiring is shared with the same line of pixels among multiple pixels disposed in a matrix pattern. The Cs wiring is usually overlapped with the transparent pixel electrode. A storage capacitance for maintaining a drain voltage is obtained by using part of the Cs wiring and transparent pixel electrodes as electrodes and using the interlayer insulating film as a dielectric to produce a capacitor.

In the TFT array substrate having the above configuration, the region including the transparent pixel electrode is used as a display region of the liquid crystal display. However, the source lines, the gate lines, the Cs wiring, and the storage capacitor electrode are formed of a metal material (for example, copper (Cu) and silver (Ag)) for achieving lower resistance. Similarly, an electrode part, such as a gate electrode, of the TFT is formed of a metal material. Accordingly, the region including these wirings serves as a light-shielding region irrespective of the alignment of the liquid crystal and is regarded as a non-display region even in a pixel region, and therefore may not be effectively employed as a display region.

Therefore, in the active matrix liquid crystal display device provided with the TFT array substrate, the area of the light-shielding region formed by each of the above wirings is required to be reduced in order to improve the ratio of the display region to all the display screens, that is, the "aperture ratio" in the pixel region.

However, in the case where the width of each of the wirings is decreased in order to improve the aperture ratio, the wiring resistance may increase. In the case of the Cs wiring, a storage capacitance necessary to prevent the cross talk and flicker of the liquid crystal display device decreases. This tendency is remarkable in the liquid crystal display device having fine pixels in particular, and the aperture ratio of the pixel region is required to be increased while the storage capacitor is secured.

Patent Document 1, for example, proposes a liquid crystal display device having a wiring/electrode on an insulating substrate. The wiring/electrode is formed by covering a laminated structure film with a transparent conductive film. The laminated structure film is formed by covering an aluminium layer or an alloy layer mainly comprising aluminium with a high-melting-point metal layer.

However, the liquid crystal display device having such a configuration essentially comprises a laminated structure film in which the alloy layer is covered with the high-melting-point metal layer. Accordingly, the step of producing a laminated structure film is further needed in addition to the step of producing a conventional TFT array substrate. Since the increase in the number of production steps leads to increases in processing cost, material cost, and the like, the aperture ratio is preferably improved in a simple step. In the case that the aluminium layer or the alloy layer mainly comprising aluminium is formed in the gate electrode part of the TFT, acid or alkali may generate electrolytic corrosion. In addition, the transparent conductive film formed on the laminated structure film is covered with the insulating film. In the case that a transparent conductive film, and then an insulating film are formed, the heat (about 350° C.) added upon forming an insulating film may change the composition of the transparent conductive film.

[Patent Document 1]
Japanese Kokai Publication No. 2001-194676

SUMMARY OF THE INVENTION

With the foregoing in view, it is an object of the present invention to provide a liquid crystal display device with a high aperture ratio in a pixel region while securing a required storage capacitance.

DISCLOSURE OF THE INVENTION

As a result of various investigations of the liquid crystal display device having a high aperture ratio in a pixel region, the present inventors have noted that the area ratio of an electrode for forming a storage capacitance is large in a non-display region in a pixel region, that is, a region including TFTs and various wirings. They have found that in the case that the electrode for forming a storage capacitance made of a metal material is a transparent electrode, the electrode for forming a storage capacitance can be a light transmission region, that is, a display region, and the aperture ratio in the pixel region can be significantly improved. They have also found that the transparent electrode is formed on the same layer as a thin film layer for improving the adhesion between a drain electrode and a gate insulating film of the TFT, whereby the aperture ratio can be improved without increasing the number of production steps. They have also found that when being formed on the gate insulating film, these transparent electrodes are not deteriorated by heat upon formation of the gate insulating film. They have also found that in the case where capacitance is formed between the transparent electrode for forming a storage capacitance and a transparent pixel electrode, a required storage capacitor is secured. As a result, the above-mentioned problems have been admirably solved, leading to completion of the present invention.

That is, the present invention is a liquid crystal display device, comprising in this order: a thin film transistor array substrate; a liquid crystal layer; and a counter substrate, the thin film transistor array substrate comprising: source lines and gate lines that are disposed on a main surface of a transparent substrate in a lattice form; a storage capacitor wiring disposed between the gate lines so as to cross the source lines; a transparent pixel electrode disposed in a pixel region defined by the source lines and the gate lines; a storage capacitor wiring disposed across the pixel region and disposed so as to cross the source lines; a thin film transistor comprising a gate electrode connected to the gate lines, a source electrode connected to the source lines, and a drain electrode connected to the transparent pixel electrode, in the vicinity of an intersection between the source lines and the gate lines; a gate insulating film arranged between the gate electrode and the source and drain electrodes in layer sequence; and an interlayer insulating film arranged between the source and drain electrodes and the transparent pixel electrode in layer sequence, wherein a first transparent electrode in a lower layer of the drain electrode and a second transparent electrode connected to the storage capacitor wiring are disposed on the gate insulating film, and the second transparent electrode faces the transparent pixel electrode with the interlayer insulating film therebetween. Thereby, the aperture ratio in the pixel region can be improved while a required storage capacitor is secured.

The second transparent electrode is preferably connected to the storage capacitor wiring via a contact hole in the gate insulating film. As a result, the first transparent electrode and the second transparent electrode can be formed in the same layer on the gate insulating film. Each of the transparent electrodes is not deteriorated by heat upon formation of the gate insulating film. In addition, the liquid crystal display device of the present invention can be produced by the same method as usual without increasing the number of production steps.

In the present invention, the source lines, the gate lines, and the Cs wiring are preferably formed of a metal material for achieving lower resistance. Similarly, a electrode part, such as a gate electrode, of the TFT is preferably formed of a metal material. Specific examples of the metal material include aluminium, molybdenum, chromium, tantalum, titanium, Cu, and Ag. These wirings, electrodes, and the like may have a laminated structure with a nitride of the metal material, indium oxide tin (ITO), or the like.

EFFECT OF THE INVENTION

In the present invention, a first transparent electrode connected to a transparent pixel electrode and a second transparent electrode connected to a storage capacitor wiring are formed on a gate insulating film, whereby the aperture ratio in a pixel region can be improved without increasing the number of steps while a required storage capacitor is secured.

BRIEF DESCRIPTION OF THE DRAWINGS

[FIG. 1]
[FIG. 2]
[FIG. 3]
[FIG. 4]
[FIG. 5]
[FIG. 6]
[FIG. 7]

EMBODIMENTS FOR CARRYING OUT THE INVENTION

The present invention will be mentioned in more detail referring to the following embodiments, but is not limited to these embodiments.

Embodiment 1

A liquid crystal display device according to Embodiment 1 has a TFT array substrate, a liquid crystal layer, and a counter substrate in this order. Specifically, the liquid crystal display device is provided with the TFT array substrate, the counter substrate provided so as to face the TFT array substrate, and the liquid crystal layer provided so as to be sandwiched between both of the substrates, and the liquid crystal layer is held via an alignment film, so that a liquid crystal display panel is formed.

In the liquid crystal display panel, a polarizer is stuck each on the back side of the TFT array substrate and the observation surface side of the counter substrate. The electric field intensity, which is applied between a transparent pixel electrode of each pixel region formed on the TFT array substrate side and a common electrode formed on the counter substrate side, is controlled, and the alignment of the liquid crystal in each pixel region is changed. Thereby, the light transmittance is changed, and the image is displayed.

Regarding the light source, The transmissive liquid crystal display device provides image display by guiding light from the back side, such as a light from a backlight that is arranged on the back side of the liquid crystal display panel, into the inside of the panel, and externally outputting the light.

The counter substrate is typically a CF substrate comprising a structure in which a color filter layer consisting of color layers and a black matrix which are formed so as to cover a transparent substrate; an insulating layer that covers the color filter layer; a common electrode; and an alignment film are laminated in this order. For example, in each pixel region, the color layers are disposed so that each of three colors, red (R), green (G), and blue (B) corresponds to each of the transparent pixel electrodes of the TFT array substrate, and each of the pixel regions is defined by the black matrix. The common electrode is formed of ITO as one electrode that corresponds not to each pixel but to multiple pixels.

In the present embodiment, the TFT array substrate has, on a gate insulating film, a first transparent electrode located lower than a drain electrode, and a second transparent electrode that is connected to a storage capacitor wiring and faces a transparent pixel electrode with an interlayer insulating film therebetween.

Figure 1:
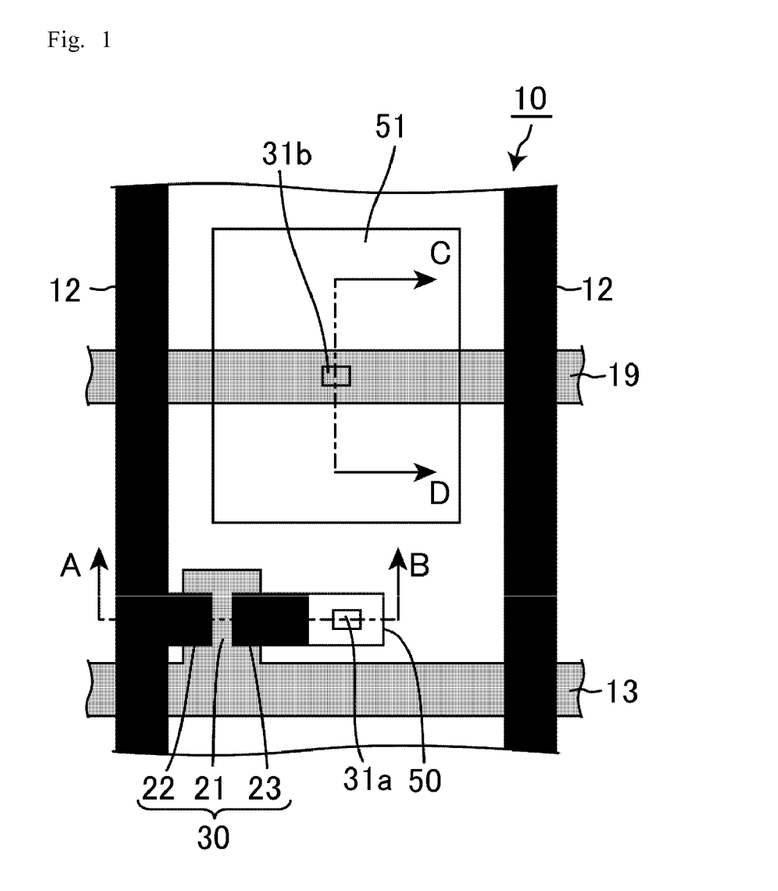
FIG. 1 is a plan view schematically illustrating a main part of a TFT array substrate of a liquid crystal display device in Embodiment 1 of the present invention.
Figure 2:
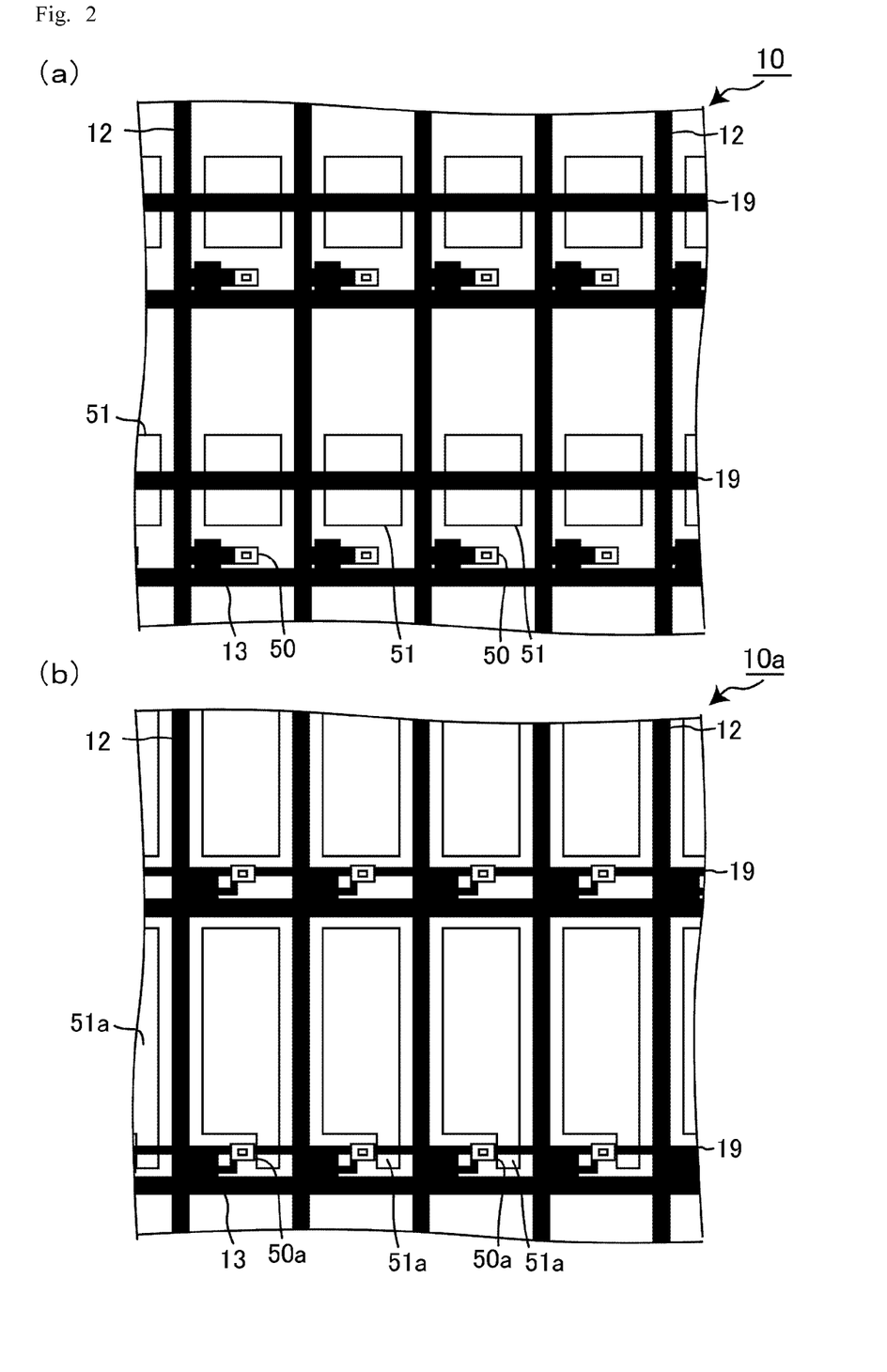
FIG. 2(a) is a plan view schematically illustrating a plurality of pixels of the TFT array substrate illustrated in FIG. 1.
FIG. 2(b) is a plan view schematically illustrating another example of the TFT array substrate of Embodiment 1.
Figure 3:
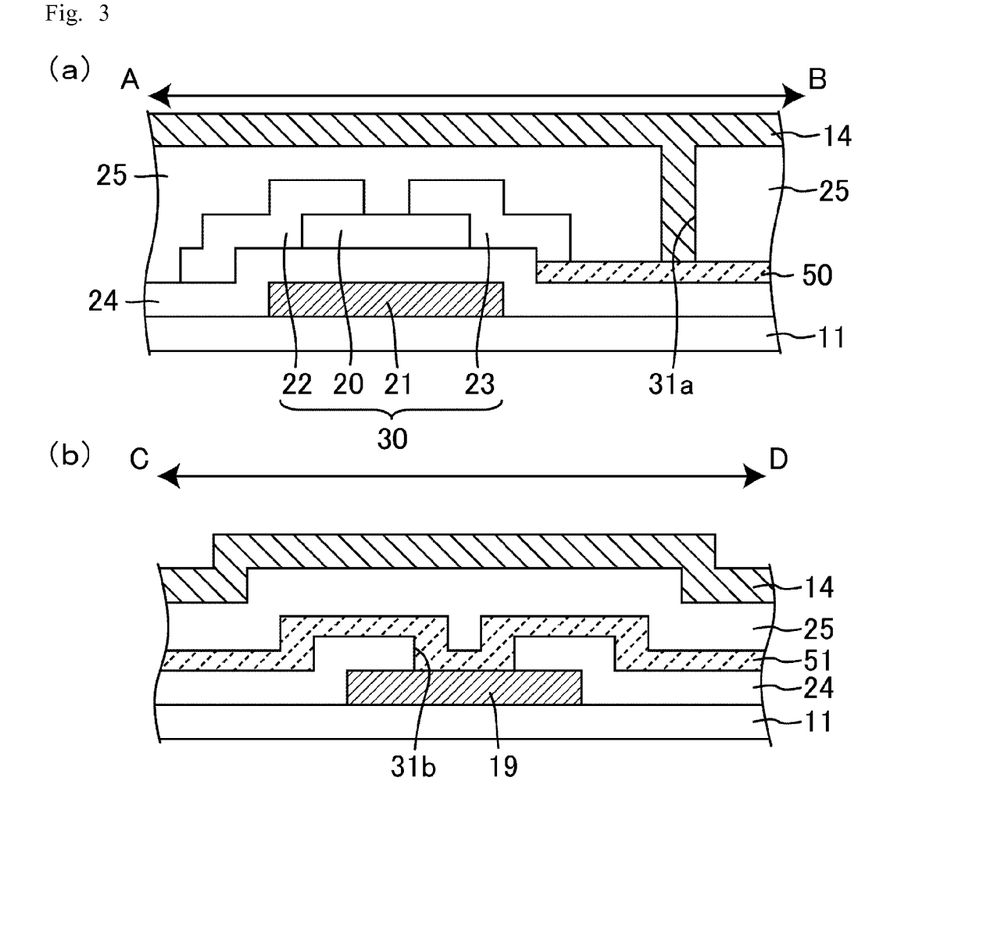
FIG. 3(a) is a cross-sectional view schematically illustrating a section taken along line A-B in FIG. 1.
FIG. 3(b) is a cross-sectional view schematically illustrating a section taken along line C-D in FIG. 1.

Hereinafter, the TFT array substrate will be described referring to FIG. 1 to FIG. 3. FIG. 1 is a plan view schematically illustrating a main part of a TFT array substrate of a liquid crystal display device in Embodiment 1 of the present invention. FIG. 2(a) is a plan view schematically illustrating a plurality of pixels of the TFT array substrate illustrated in FIG. 1. FIG. 3(a) is a cross-sectional view schematically illustrating a section taken along line A-B in FIG. 1, and FIG. 3(b) is a cross-sectional view schematically illustrating a section taken along line C-D in FIG. 1.

In FIG. 1 and FIG. 2(a), a TFT array substrate 10 is provided with source lines 12 and gate lines 13 that are disposed in a lattice form on a main surface of a transparent substrate made of a glass substrate or a plastic substrate. A Cs wiring 19 is disposed between the gate lines 13 so as to cross the source lines 12. The identical Cs wiring 19 is shared with the same line of pixels among multiple pixels disposed in a matrix pattern. The gate lines 13 are formed of a laminated body of titanium nitride (TiN)/tantalum (Ta)/tantalum nitride (TaN) in this order from the upper layer side, and the source lines 12 are formed of a laminated body of tantalum (Ta)/tantalum nitride (TaN)/ITO in this order from the upper layer side. The Cs wiring 19 is formed of the material of the gate lines 13.

Although not illustrated in FIG. 1 and FIG. 2(a), a transparent pixel electrode is disposed in a pixel region divided by the source lines 12 and the gate lines 13. The transparent pixel electrode is disposed in the entire pixel region including the overlapped regions with the source lines 12 and the gate lines 13 in order to improve the aperture ratio, and used for application of voltage to the liquid crystal layer.

A TFT 30 is formed in the vicinity of the intersection between the source lines 12 and the gate lines 13. The TFT 30 has a gate electrode 21 connected to the gate lines 13, a source electrode 22 connected to the source lines 12, a drain electrode 23, and a semiconductor layer. The semiconductor layer is typically made of an amorphous silicone (a-Si) or a polysilicon film.

Here, a first transparent electrode 50 and a second transparent electrode 51 are formed in a pixel region surrounded by the gate lines 13 and the source lines 12. Referring to FIGS. 3(a) and 3(b), the first transparent electrode 50 and the second transparent electrode 51 will be described.

In FIG. 3 (a), the gate electrode 21 is formed on the main surface of the transparent substrate 11, and a gate insulating film 24 is formed so as to cover the gate electrode 21. The semiconductor layer 20, the source electrode 22, and the drain electrode 23 are formed on the upper part of the gate electrode 21 via the gate insulating film 24 to configure the TFT 30. The TFT 30 individually and selectively controls a transparent pixel electrode 14 formed thereon.

The first transparent electrode 50 connected to the transparent pixel electrode 14 is formed on the gate insulating film 24. The TFT 30 and the first transparent electrode 50 are covered with an interlayer insulating film 25, and the transparent pixel electrode 14 is disposed on the interlayer insulating film 25. The first transparent electrode 50 and the transparent pixel electrode 14 are electrically connected via a contact hole 31a formed in the interlayer insulating film 25.

The first transparent electrode 50 is a thin film layer formed in the TFT 30 for the improvement in adhesion between the drain electrode 23 and the gate insulating film 24. In the present embodiment, this thin film layer is formed with a transparent electrode material. In a conventional liquid crystal display device, a transparent pixel electrode is connected to a drain electrode made of a metal material, and therefore a connection region between the transparent pixel electrode and the drain electrode is a non-display region. However, in the present embodiment, the transparent pixel electrode 14 is connected to the first transparent electrode 50, and therefore the connection region can be a display region, resulting in improvement in the aperture ratio in the pixel region.

In FIG. 3(b), the Cs wiring 19 made of the same material as that of the gate lines 13 is formed on the transparent substrate 11 and covered with the gate insulating film 24. The second transparent electrode 51 connected to the Cs wiring 19 is formed on the gate insulating film 24, and the second transparent electrode 51 and the Cs wiring 19 are connected via a contact hole 31b formed in the gate insulating film 24. The transparent pixel electrode 14 is formed on the second transparent electrode 51 via the interlayer insulating film 25.

A storage capacitance is obtained by using part of the second transparent electrode 51 and transparent pixel electrode 14 as electrodes and using the interlayer insulating film 25 as a dielectric to produce a capacitor. The second transparent electrode 51 is formed of a transparent electrode material. Therefore, the area of the second transparent electrode 51 can be adjusted irrespective of the aperture ratio, and a required storage capacitor can be secured.

In a conventional liquid crystal display device, a storage capacitor electrode for forming a storage capacitance is formed of a metal material. Therefore, the area ratio of the storage capacitor electrode in a non-display region is large. In the present embodiment, because the second transparent electrode 51 configures the storage capacitor electrode, a light transmission region, that is, a display region is increased, and thereby the aperture ratio in a pixel region can be significantly improved. The improvement in aperture ratio can contribute not only to the improvement in luminance caused by the increase in the display region, but also to lower power consumption caused by the reduction in light volume of a backlight.

The first transparent electrode 50 and the second transparent electrode 51 are each formed on the gate insulating film 24. Accordingly, at a temperature as high as about 350° C. upon forming the gate insulating film 24, the first transparent electrode 50 and the second transparent electrode 51 are not deteriorated and can perform the function of a transparent electrode.

The first transparent electrode 50 and the second transparent electrode 51 are made of the same material, and formed on the gate insulating film 24 simultaneously as the ITO film, the lowest layer of the source lines 12. Accordingly, these three are formed in one step. Examples of other transparent conductive materials of the first transparent electrode 50 and the second transparent electrode 51 include indium zinc oxide (IZO) and zinc oxide.

The first transparent electrode 50 is a thin film layer for the improvement in adhesion between the drain electrode 23 and the gate insulating film 24 in the gate electrode 21 part of the TFT 30, and an ITO film, the lowest layer of the source lines 12, is used. Thus, the first transparent electrode 50 can be formed without increasing the number of production steps (i.e., without increasing processing cost and material cost).

As described above, in the present embodiment, the first transparent electrode 50 and the second transparent electrode 51 are provided on the gate insulating film 24, whereby a high aperture ratio can be achieved without increasing the number of steps while the storage capacitance is secured.

The liquid crystal display device according to the present embodiment is not particularly limited by other components as long as it is an active matrix liquid crystal display device essentially comprising the above components of TFT array substrate 10. The shape of the first transparent electrode 50 and the second transparent electrode 51 is not particularly limited as long as they exert the above effects.

FIG. 2(b) is a plan view schematically illustrating another example of the TFT array substrate of Embodiment 1. In FIG. 2(b), the same numerals are applied to the components having the same configurations as in FIG. 2(a), and the description thereof is omitted. The same effects can be exerted also in the TFT array substrate 10a that has the shape of the first transparent electrode 50a and the second transparent electrode 51a as illustrated in FIG. 2(b).

Hereinafter, the structure of the TFT array substrate according to comparative embodiments will be described referring to the drawings.

Comparative Embodiment 1

Figure 4:
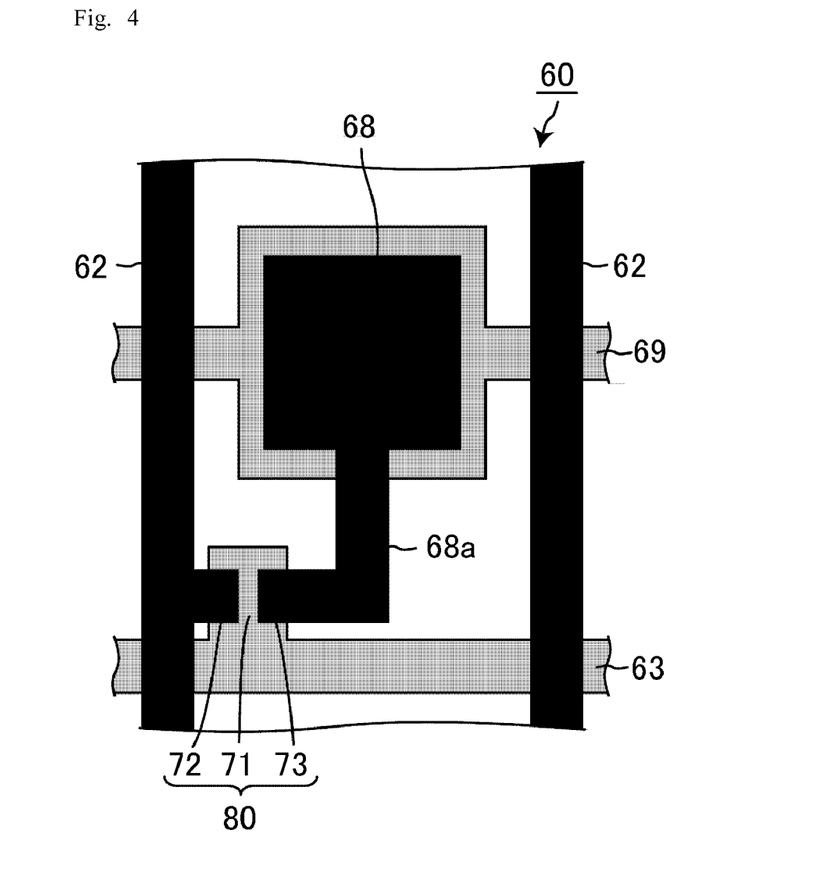
FIG. 4 is a plan view schematically illustrating a main part of a TFT array substrate of a liquid crystal display device in Comparative Embodiment 1.
Figure 5:
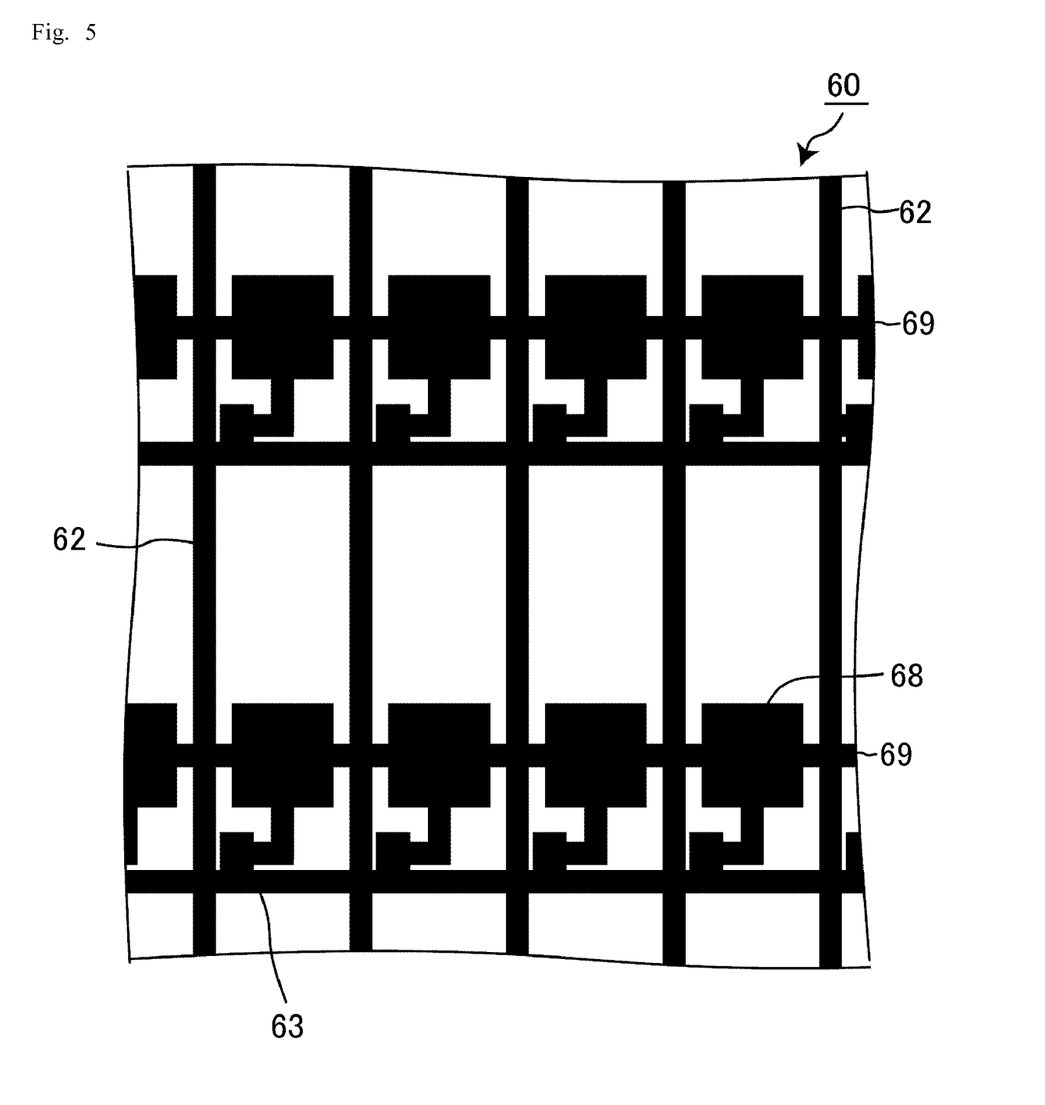
FIG. 5 is a plan view schematically illustrating a plurality of pixels of the TFT array substrate illustrated in FIG. 4.

FIG. 4 is a plan view schematically illustrating a main part of a TFT array substrate of a liquid crystal display device in Comparative Embodiment 1. FIG. 5 is a plan view schematically illustrating a plurality of pixels of the TFT array substrate illustrated in FIG. 4.

In FIG. 4 and FIG. 5, a TFT array substrate 60 is provided with source lines 62 and gate lines 63 that are disposed on the main surface of a transparent substrate in a lattice form. Although not illustrated in FIG. 4 and FIG. 5, a transparent pixel electrode is disposed in a pixel region defined by the source lines 62 and the gate lines 63. A TFT 80 is disposed in the vicinity of the intersection between the source lines 62 and the gate lines 63.

The TFT 80 comprises a gate electrode 71 connected to the gate lines 63, a source electrode 72 connected to the source lines 62, and a drain electrode 73 connected to the transparent pixel electrode, and further comprises a semiconductor layer. The gate electrode 71 is covered with the gate insulating film. The TFT 80 individually and selectively controls the transparent pixel electrode.

A Cs wiring 69 is disposed between the gate lines 63 so as to cross the source lines 62. Multiple Cs wirings 69 are formed in parallel with each other on the TFT array substrate 60, and the identical Cs wiring 69 is shared with the same line of pixels among multiple pixels disposed in a matrix pattern.

Here, a storage capacitor electrode 68 is overlapped with the transparent pixel electrode in the Cs wiring 69. The Cs wiring 69 and the storage capacitor electrode 68 are formed of the same material as that of the gate lines 63 and the source lines 62, that is, a metal material. The storage capacitor electrode 68 is connected to the drain electrode 73 via a wiring 68a. A storage capacitance for maintaining a drain voltage capacitor can be obtained by using part of the storage capacitor electrodes 68 (part of the Cs wiring 69) and a transparent pixel electrode as electrodes and using a gate insulating film as a dielectric to produce a capacitor.

In the TFT array substrate 60 having the above configuration, the storage capacitor electrode 68 is formed of a metal material and connected to the drain electrode 73. Accordingly, a non-display region in the pixel region is larger than that in the liquid crystal display device in Embodiment 1. This is apparent also from the comparison of FIG. 2 in Embodiment 1 with FIG. 5 in Comparative Embodiment 1.

In FIG. 2 and FIG. 5, black parts represent non-display regions. The comparison of FIG. 2 with FIG. 5 shows that non-display regions are much smaller in FIG. 2 and therefore the liquid crystal display device according to Embodiment 1 has a higher aperture ratio than that of the liquid crystal display device according to Comparative Embodiment 1.

Comparative Embodiment 2

Figure 6:
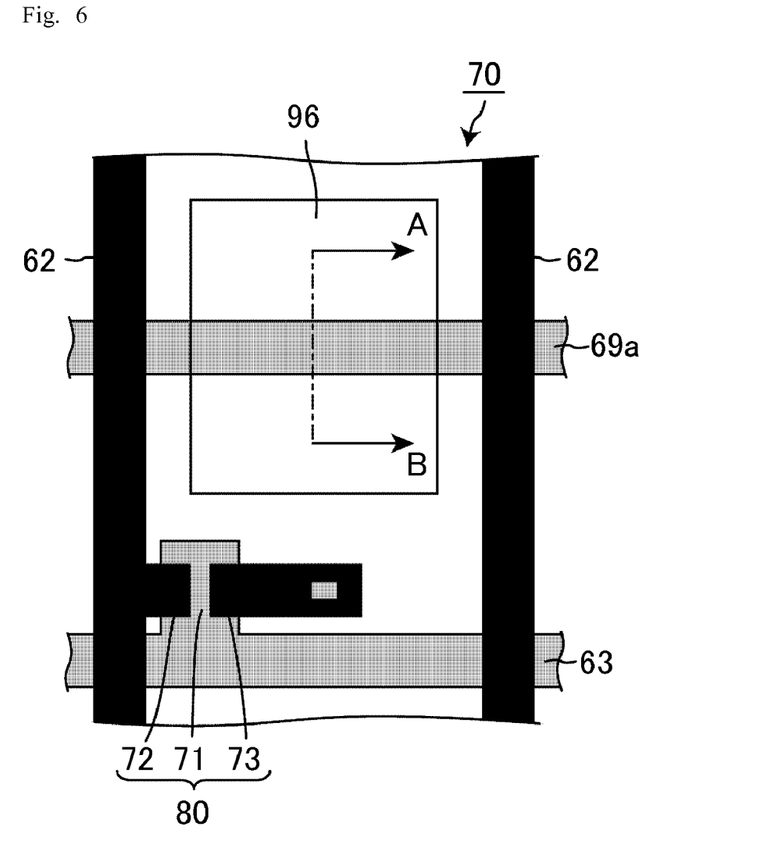
FIG. 6 is a plan view schematically illustrating a main part of a TFT array substrate of a liquid crystal display device in Comparative Embodiment 2.
Figure 7:
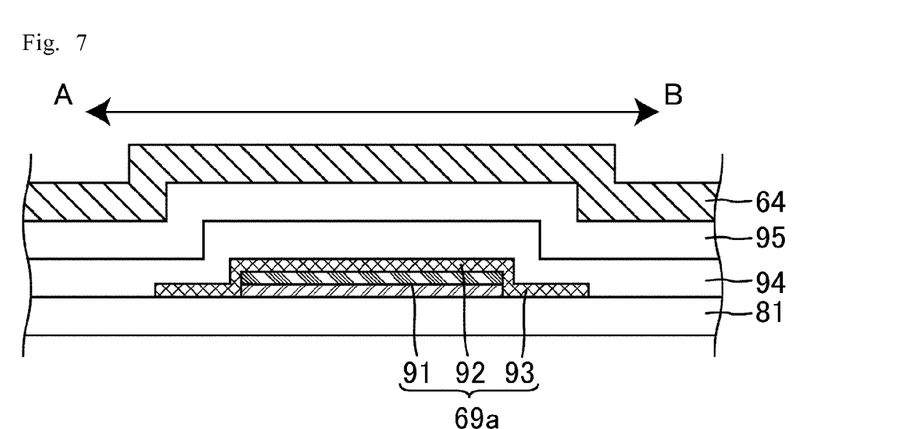
FIG. 7 is a cross-sectional view schematically illustrating a section taken along line A-B in FIG. 6.

FIG. 6 is a plan view schematically illustrating a main part of a TFT array substrate of a liquid crystal display device in Comparative Embodiment 2. FIG. 7 is a cross-sectional view schematically illustrating a section taken along line A-B in FIG. 6. In FIGS. 6 and 7, the same numerals are applied to the components having the same configurations as in FIGS. 4 and 5, and the description thereof is omitted.

In FIG. 6 and FIG. 7, a transparent electrode 96 is formed in a position opposite to a transparent pixel electrode 64. The transparent electrode 96 is an electrode integrally formed with part of a Cs wiring 69a as described later.

In FIG. 7, the Cs wiring 69a is formed on a transparent substrate 81 and covered with a gate insulating film 94. The transparent pixel electrode 64 is formed on the gate insulating film 94 via an interlayer insulating film 95.

Here, the Cs wiring 69a comprises the configuration of wirings/electrodes in which a laminated structure film is covered with a transparent conductive film 93. The laminated structure film consists of an alloy layer 91 comprising or mainly comprising aluminium and a high-melting-point metal layer 92 that covers the alloy layer 91. The transparent electrode 96 is formed of the transparent conductive film 93, part of the Cs wiring 69a, and integrated with the Cs wiring 69a.

A storage capacitance is formed between the transparent electrode 96 and the transparent pixel electrode 64 by using the gate insulating film 94 and the interlayer insulating film 95 as a capacitance.

The liquid crystal display device having the above configuration has an aperture ratio higher than that of the liquid crystal display device shown in Comparative Embodiment 1. However, the Cs wiring 69a essentially comprises a laminated structure film made of the alloy layer 91 and the high-melting-point metal layer 92. Therefore, the step of forming the laminated structure film is required, leading to increases in processing cost and material cost. In forming the alloy layer 91 comprising or mainly comprising aluminium in a region provided with the gate electrode 71 of the TFT, acid or alkali may cause electrolytic corrosion. In addition, since the transparent conductive film 93 and the transparent electrode 96 are covered with the gate insulating film 94, the heat (about 350° C.) added upon forming the gate insulating film 94 may change the composition.

In the liquid crystal display device according to Embodiment 1, the first transparent electrode 50 and the second transparent electrode 51 are provided on the gate insulating film 24. Thereby, a high aperture ratio can be achieved without increasing the number of steps or degrading the transparent electrode while a storage capacitance is secured.

The present application claims priority to Patent Application No. 2008-297926 filed in Japan on November 21, 2008 under the Paris Convention and provisions of national law in a designated State, the entire contents of which are hereby incorporated by reference.

EXPLANATION OF NUMERALS AND SYMBOLS 10, 10a, 60, 70 TFT array substrate
11, 81 Transparent substrate
12, 62 Source lines
13, 63 Gate lines
14, 64 Transparent pixel electrode
19, 69, 69a Storage capacitor wiring (Cs wiring)
20 Semiconductor layer
21, 71 Gate electrode
22, 72 Source electrode
23, 73 Drain electrode
24, 94 Gate insulating film
25, 95 Interlayer insulating film
30, 80 Thin film transistor (TFT)
31a, 31b Contact hole
50, 50a First transparent electrode
51, 51a Second transparent electrode
68 Storage capacitor electrode
68a Wiring
91 Alloy layer comprising or mainly comprising aluminium
92 High-melting-point metal layer
93 Transparent conductive film
96 Transparent electrode

The invention claimed is:

1. A liquid crystal display device, comprising in this order:
a thin film transistor array substrate;
a liquid crystal layer; and
a counter substrate,
the thin film transistor array substrate comprising:
source lines and gate lines that are disposed on a main surface of a transparent substrate in a lattice form;
a storage capacitor wiring disposed between the gate lines so as to cross the source lines;
a transparent pixel electrode disposed in a pixel region defined by the sources lines and the gate lines;
a thin film transistor comprising a gate electrode connected to the gate lines, a source electrode connected to the source lines, and a drain electrode connected to the transparent pixel electrode, in the vicinity of an intersection between the source lines and the gate lines;
a gate insulating film arranged between the gate electrode and the source and drain electrodes in layer sequence; and
an interlayer insulating film arranged between the source and drain electrodes and the transparent pixel electrode in layer sequence,
wherein a first transparent electrode in a lower layer of the drain electrode and a second transparent electrode connected to the storage capacitor wiring are disposed on the gate insulating film, and
the second transparent electrode faces the transparent pixel electrode with the interlayer insulating film therebetween.

2. The liquid crystal display device according to claim 1, wherein the second transparent electrode is connected to the storage capacitor wiring via a contact hole in the gate insulating film.

* * * * *